United States Patent [19]

Schuster

[11] 4,295,064

[45] Oct. 13, 1981

[54] LOGIC AND ARRAY LOGIC DRIVING CIRCUITS

[75] Inventor: Stanley E. Schuster, Granite Springs, N.Y.

[73] Assignee: International Business Machines Corporation, Armonk, N.Y.

[21] Appl. No.: 920,943

[22] Filed: Jun. 30, 1978

[51] Int. Cl.$^3$ .................. H03K 19/173; H03K 19/20; H03K 19/094
[52] U.S. Cl. .................................... 307/468; 307/270
[58] Field of Search .............. 307/203, 205, 207, 270, 307/445, 465, 468; 364/716, 718

[56] References Cited

U.S. PATENT DOCUMENTS

| | | | |
|---|---|---|---|
| 3,806,880 | 4/1974 | Spence | 307/205 X |
| 3,946,245 | 3/1976 | McClaughry | 307/205 |
| 3,993,919 | 11/1976 | Cox et al. | 307/205 X |
| 4,001,601 | 1/1977 | Schuster | 307/205 |
| 4,032,894 | 6/1977 | Williams | 307/205 X |
| 4,057,787 | 11/1977 | Heuer et al. | 307/205 X |
| 4,071,783 | 1/1978 | Knepper | 307/205 X |
| 4,103,189 | 7/1978 | Perlegos et al. | 307/205 X |
| 4,110,633 | 8/1978 | Blaser et al. | 307/205 |
| 4,123,669 | 10/1978 | Devine et al. | 307/205 |
| 4,129,794 | 12/1978 | Dickson et al. | 307/DIG. 1 X |
| 4,140,921 | 2/1979 | Balasubramanian et al. | 307/205 X |

FOREIGN PATENT DOCUMENTS 52-39354 3/1977 Japan .................................. 307/270

OTHER PUBLICATIONS

Balasubramanian et al., "Two-Bit Partitioning Driver"; IBM Tech. Discl. Bull.; vol. 18, No. 9, pp. 2958-2959; 2/1976.
Delahanty et al., "PLA Driver with Integral Race Prevention"; IBM Tech. Discl. Bull.; vol. 19, No. 1, pp. 152-153; 6/1976.
Aoki et al., "Driver Circuit Using Enhancement Depletion FET", IBM Tech. Discl. Bull.; vol. 16, No. 11, p. 3713; 4/1974.
Blaser et al., "FET Logic Configuration"; 1978 IEEE—Int'l. Solid-State Circuits Conference, 2/15/78; pp. 14-15 (Digest of Technical Papers).
Fleisher et al., "An Introduction to Array Logic"; IBM Journal of Research and Development; pp. 98-109; 3/1975.
HSU, "True, Push-Pull Driver"; IBM Tech. Discl. Bull.; vol. 19, No. 3, pp. 998-999; 8/76.

Primary Examiner—Larry N. Anagnos
Attorney, Agent, or Firm—Alvin J. Riddles

[57] ABSTRACT

A push-pull driver circuit wherein the input signals is applied to turn on one of two transistors mounted in series and the inversion of that signal is applied to the second transistor in the series path and the output taken from between them operates to isolate the load and since one and only one of the two transistors in the series path is conducting there is a path to charge and discharge the load capacitance but no path through both devices for power dissipation. The driver circuit can be built into a 2-bit partitioning circuit which in turn, when used with a programmed logic array and the relative capacitance of the various parts being isolated from each other by a coupling circuit, the resulting assembly provides a high performance programmed array logic device.

3 Claims, 8 Drawing Figures

LOGIC AND ARRAY LOGIC DRIVING CIRCUITS

DESCRIPTION

1. Technical Field

The invention relates to the driving of capacitance associated with FET switching circuits and to the incorporation of these driving circuits into programmed logic arrays.

2. Background Art

Programmed logic arrays have been assembled in varying configurations but as the art has developed, the arrays presently in use consist of a large "AND" circuit matrix commonly known as a "SEARCH" section, the outputs of which enter with "OR" circuit matrix section commonly known as a "READ" section. In recent times, to this arrangement has been added a section known as a "PREARRAY LOGIC" section which, in essence, takes the particular input bits and provides on separate lines all of the logical combinations.

One description of the programmed array logic is that it acts like a memory in that when it sees or has impressed at the input a bit pattern, that bit pattern is used as an address in the "SEARCH" section and then the array through the "READ" section produces a bit at the output which is indicative of the type of bit pattern impressed at the input and the specific interconnections or personality of the "SEARCH" and "READ" arrays. Programmed array logic devices are used primarily to reduce the design complexity by using building blocks which are substantially larger than single circuits. The programmed array logic or PLA which is relatively simple to design, is also capable of performing diverse logic functions. In large scale integration as the structures become more complex, the cost goes up and more varied uses for the structure are needed to provide large enough production runs to keep the cost down. Further, there are what is known as engineering changes which are structural changes after the structure is being manufactured. The programmed array logic is useful in this case.

There is, however, in this state of the art a problem with the effect of array capacitance on performance and there is a need for a programmed array logic assembly wherein the effective capacitance as the larger arrays are assembled, has a lesser effect on the overall delay of the device.

BRIEF DESCRIPTION OF THE INVENTION

The invention is a load isolating FET push-pull driver. The driver can be incorporated into the bit partitioning prearray logic section of a programmed array logic structure. The programmed array logic structure in turn, when assembled with isolation circuitry between the "SEARCH" and "READ" sections produces a highly efficient programmed array logic device.

BEST MODE FOR CARRYING OUT THE INVENTION

Figure 1:
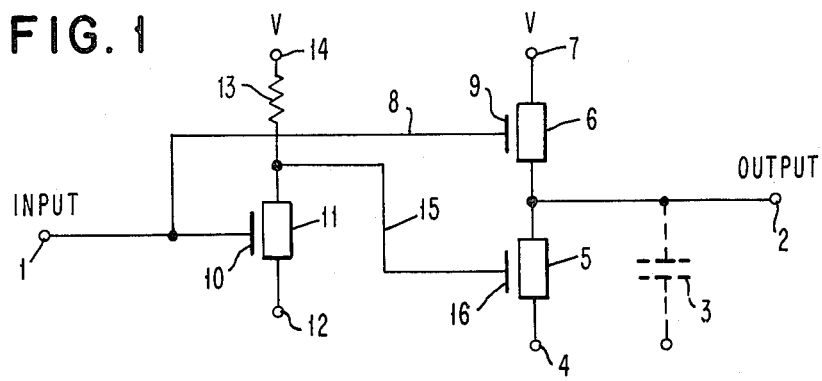
FIG. 1 is an illustration of the push-pull driver of the invention.

Referring to FIG. 1, the field effect transistor push-pull driver is illustrated. A signal at an input terminal 1 operates to produce an output signal at a terminal 2 with the characteristics that, in the output stage of the driver, there is always a path which operates to charge or discharge the large characteristic capacitance of the load being driven shown dotted as element 3. This is accomplished in accordance with the invention by having a push-pull type of output stage from a reference potential terminal labelled 4. Two FET transistors 5 and 6 are connected in series from source-to-drain to a drive potential at terminal 7 labelled V. The input signal appearing at the terminal 1 is applied to the gate 10 of transistor 11 which is connected, source-to-drain, between the reference potential terminal 12 through a load impedance 13 to a drive potential terminal 14 labelled V. Under these circumstances, the input signal applied to gate 10 is inverted and then via conductor 15 and is applied at gate 16 of transistor 5. The result of this situation is that the input signal is applied to the series transistor 6 directly and to transistor 5 inverted so that in one input condition one or the other of transistors 5 or 6 is "On" and when the input signal is in the other condition the opposite one of transistors 5 or 6 is "ON". This results in a path always being present for the capacitor 3 to charge or discharge. Hence, the characteristic load capacitance 3 is always discharged through transistor 5 and charged through transistor 6. Transistors 5 and 6 can be selected to meet the requirements of driving a characteristic load capacitance as shown by capacitor 3. This type of driver has the advantage that its delay increases very slowly as the size of the characteristic capacitance 3 goes up as heavier and heavier loads are driven.

Figure 2:
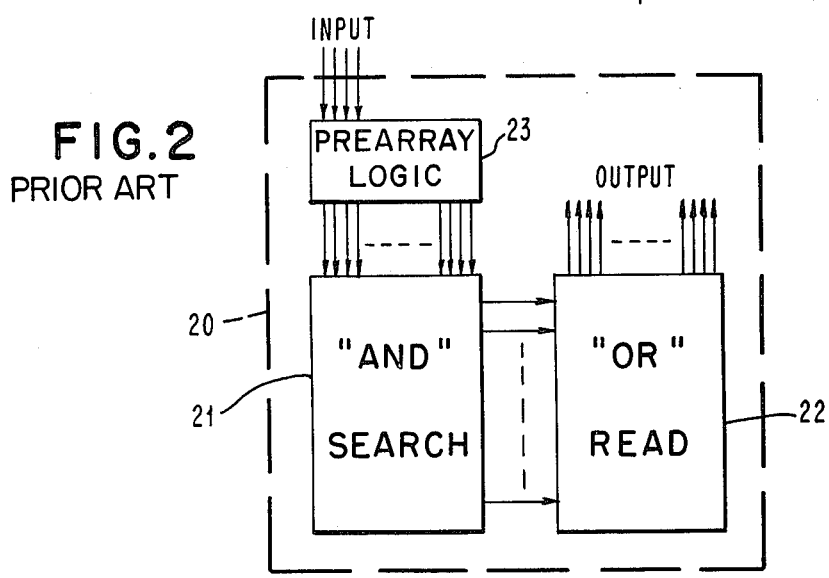
FIG. 2 is an illustration of the general layout of a programmed array logic structure.

The output driver of FIG. 1 is particularly useful in connection with logic devices known as programmed array logic. Referring to FIG. 2 a programmed array logic chip is illustrated. The chip outline is schematically shown as element 20, the "AND" logic or "SEARCH" section is schematically shown as element 21, the "OR" logic or "READ" section is shown as element 22 and the "REARRAY" logic section is schematically shown as element 23 with some inputs and outputs illustrated.

The push-pull driver of FIG. 1 is particularly valuable in the PLA of FIG. 2 because of the large capacitance driven by the prearray logic output of section 23. This capacitance is caused by the large number of devices within the "AND" logic or "SEARCH" section 21 which must be driven by the prearray logic.

Figure 3:
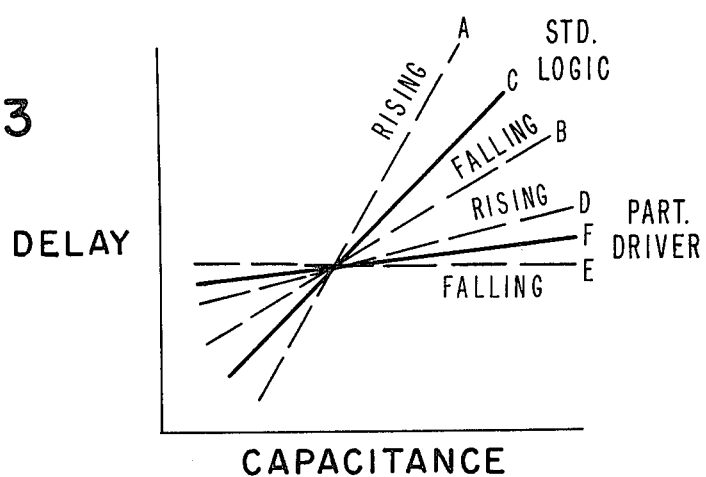
FIG. 3 is a graph plotting delay in a programmed array logic circuit versus the capacitance.

The advantage gained as capacitance increases is illustrated in connection with the graph of FIG. 3 which shows that a delay in switching is directly associated with the capacitance of the array. In FIG. 3 for the condition where standard logic is used in the "PREARRAY" section, the rising delay is shown dotted and labelled A, the falling delay is shown dotted and labelled B. The average of rising and falling is labelled C which is a solid line. In contrast, when the push-pull driver of FIG. 1 is incorporated in a partitioning circuit, a substantial reduction in delay is illustrated. The rising delay is labelled D and is shown dotted, the falling delay shown dotted and labelled E and the average delay is shown solid and labelled F. The advantage increases as the total capacitance goes up. In other words, as the array becomes larger and larger, the separation between the standard logic delay and the partitioning driver delay becomes greater and greater and the advantage increases.

Figure 4:
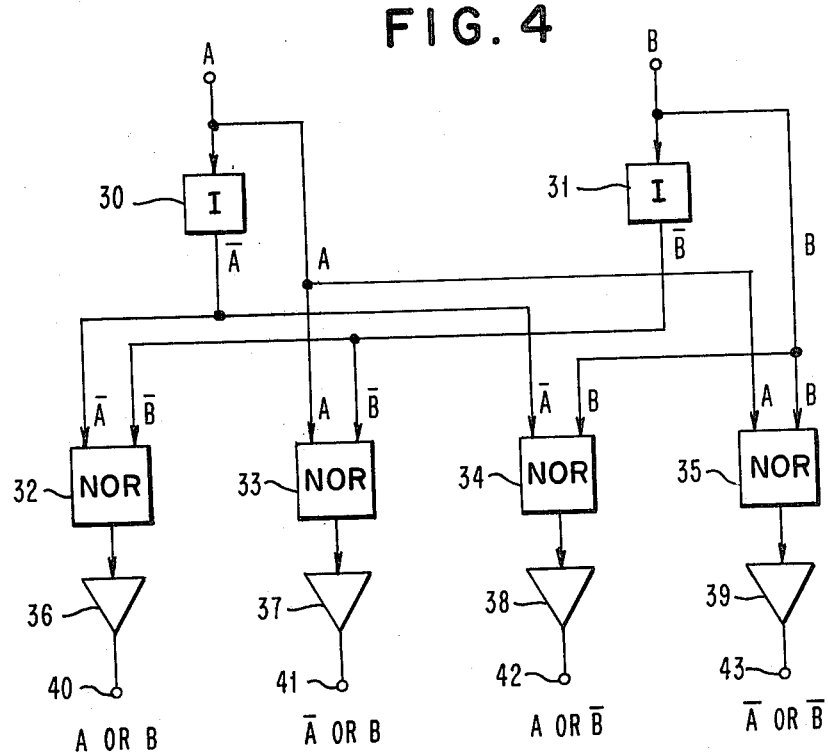
FIG. 4 is an illustration of a prearray logic section of the structure of FIG. 2.

Referring next to FIG. 4 schematic is shown of a typical partitioning driver wherein for illustration, 2 logic variables A and B are passed through inverters 30, 31, respectively and the inverted outputs combined with the original variables are then applied to logic circuits 32 through 35, the output of which enter driver circuits 36 to 39 which in turn enter terminals 40 to 43. At terminal 40 the logical function A or B is present at terminal 41, the logical function $\overline{A}$ or B is present, at terminal 42 the logic function A or $\overline{B}$ is present and at terminal 43 the logic function $\overline{A}$ or $\overline{B}$ is present.

Figure 5:
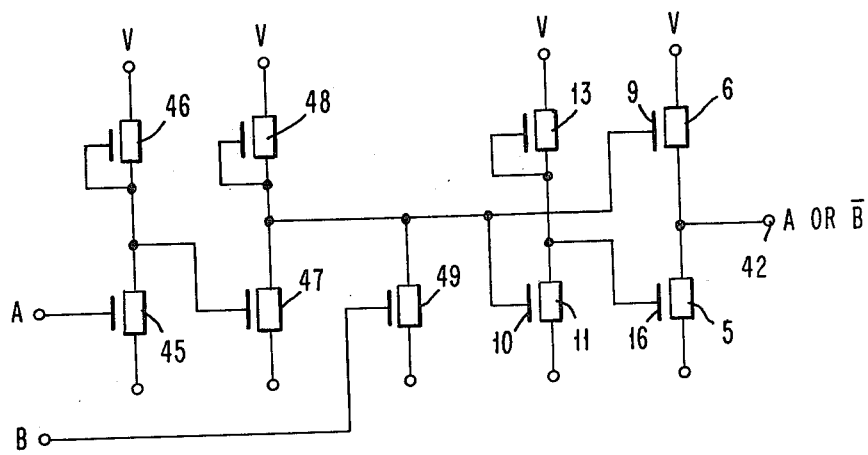
FIG. 5 is a circuit illustration of one portion of FIG. 4 incorporating the push-pull driver of FIG. 1.

Referring next to FIG. 5 an illustration for one terminal in this case terminal 42 of FIG. 4, is shown of how the push-pull driver of FIG. 1 is incorporated into the circuitry.

In FIG. 5 the variable A is applied at the gate of transistor 45 which is connected between a reference potential and a drive potential and V through a load which is illustrated as a depletion mode transistor 46. The inverted output of variable A is then applied to the gate of a transistor 47 which in turn is connected through a load transistor 48 to drive potential V. The variable B is impressed at the gate of a transistor 49. The drains of transistors 47 and 49 are combined through load transistor 48 to drive potential V. At this point the driver as is illustrated in FIG. 1 is incorporated. Using the same numerals as FIG. 1, the signal is applied to the gate 10 of transistor 11 which is connected to potential V through depletion node transistor 13.

The inverted output of transistor 11 is connected to gate 16 of transistor 5 and the signal appearing at the drains of transistors 47 and 49 is also impressed at the gate 9 of transistor 6. With this arrangement the logical function A or $\overline{B}$ appears at terminal 42. The driving stage involving serially connected transistors 5 and 6 is such that only one of the transistors 5 or 6 is on at any given time. Thus only transistor 6 is on when output 42 is high or charging to a high level and only transistor 5 is on when output 42 is low or falling low. Since both transistors 5 and 6 are never on simultaneously, a path never exists between the drain of transistor 6 and the source of transistor 5. This eliminates any d.c. power dissipation in the output stage of the push-pull driver. The specifications of transistors 5 and 6 can be selected to more efficiently switch the load at terminal 42 as the "SEARCH" section 21 of the array of FIG. 2 becomes larger.

It should be noted that the combination of transistors 47 and 49 logic inputs with the driver transistors 11, 13, 5 and 6 provides an advantageous logical combination wherein the capacitance at the points where the logic signals A and B appear is not affected and is isolated from the capacitance effect of the drive stage made up of transistors 11, 13, 5 and 6.

Figure 6:
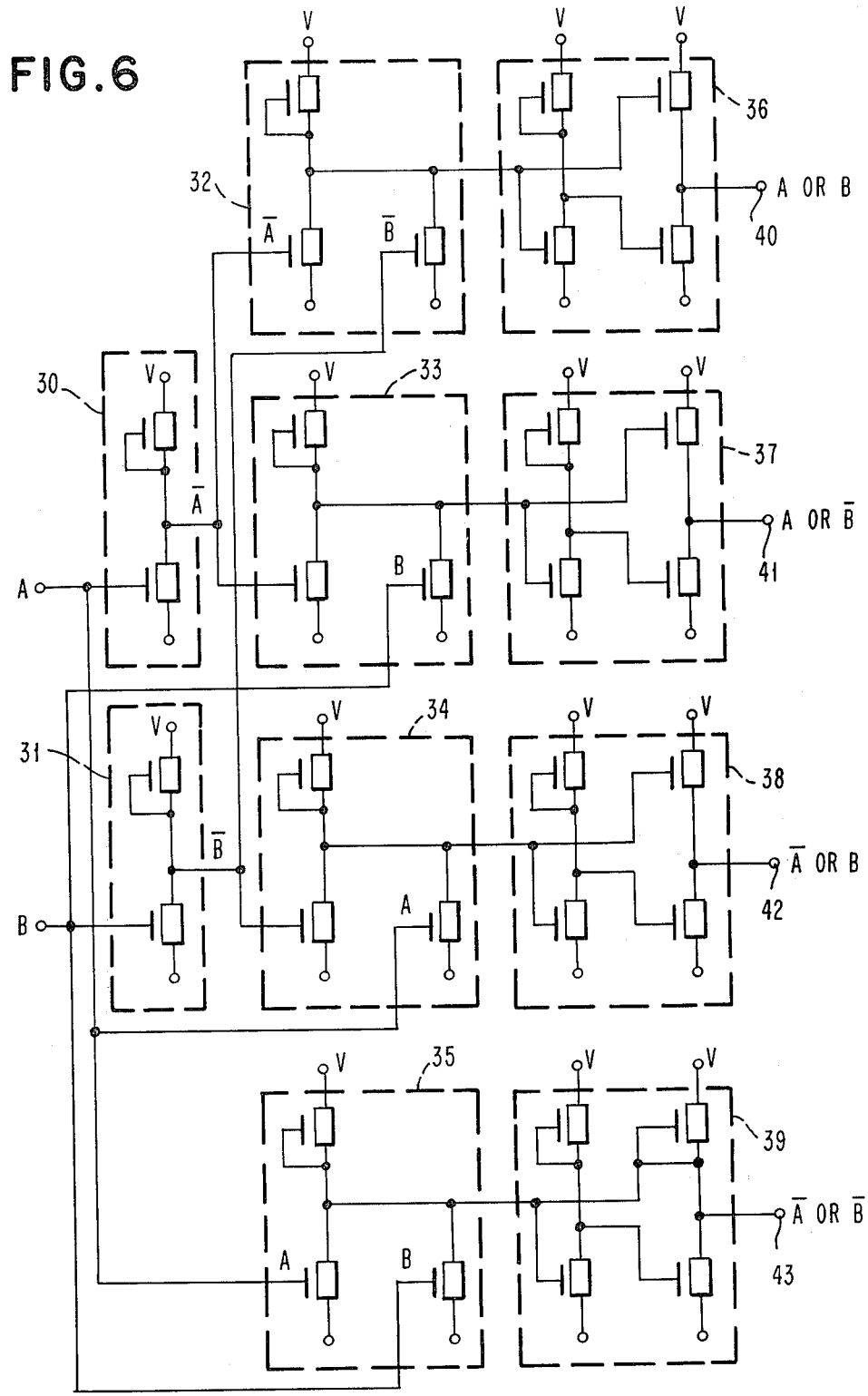
FIG. 6 is a repeat of FIG. 5 for the entire interconnection arrangement of FIG. 4.

Referring next to FIG. 6 an expanded view is provided of the entire partitioning driver. In accordance with the invention, each logic variable is inverted and both the inverted value and the value itself is combined in a logic circuit with a driver in series. Thus all logic combinations of the logic variables present is provided. This is illustrated in connection with FIG. 6 again using two variables A and B and using the terminology employed in previous figures. In FIG. 6 while the device numerals can be correlated with previous figures, dotted designations are shown for stages to improve clarity. The variable A is inverted in a stage shown dotted and labelled 30 yielding the value $\overline{A}$. Similarly, the value B is inverted in a stage labelled 31. The outputs of the stages 30 and 31 labelled $\overline{A}$ and $\overline{B}$, respectively, and the original variables A and B are then spread into four separate paths terminating in terminals 40 to 43 corresponding to those terminal numerals used in FIG. 4. The individual paths enter into individual logic sections labelled 32 through 35 and the output of each logic section is in turn fed to drivers 36 through 39.

In accordance with the invention, the push-pull driver becomes an integral portion of the overall bit partitioning circuit and the combination provides the advantages when incorporated in prearray logic section of a programmed array logic device. Further, in accordance with the invention, a programmed logic array in which the operating sections are different in function or size and hence will have substantial differences in capacitance, will be materially enhanced if the individual portions of the array are separated and isolating circuitry is employed in joining the sections.

One type of isolating circuitry is set forth in the technical publication of Eugene M. Blazer and Donald A. Conrad in a 1978 IEEE International Solid State Circuits Conference. With this type of isolation, advantages are gained in that the individual signal swings no longer are required to traverse the full voltage with a consequent improvement in the charging current for distributed capacitance.

Figure 7:
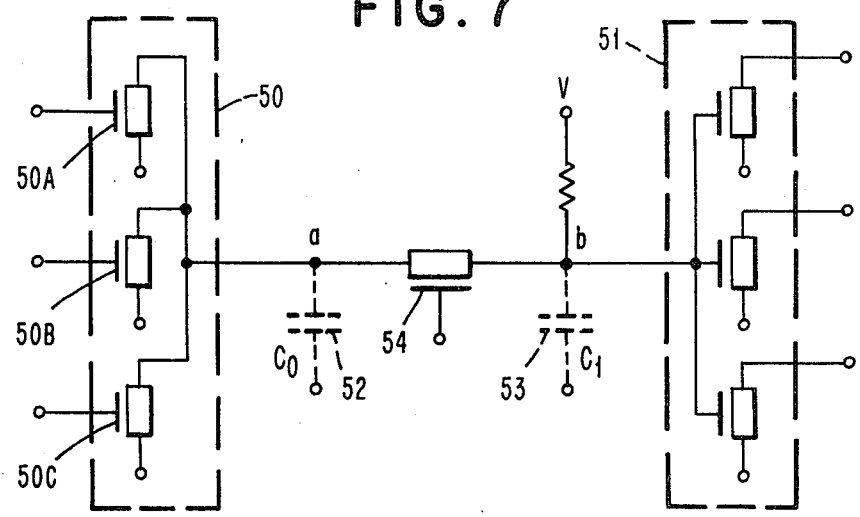
FIG. 7 is an illustration of an isolation type coupling used between the sections of the array logic of FIG. 2.

The isolating concept is illustrated in FIG. 7 wherein the capacitance being charged through a load resistor connected to node b or discharged through devices 50A, 50B or 50C in section 50 has been divided into a capacitance $C_O$ 52 and a capacitance $C_1$ 53 by the transfer or isolating device 54. The purpose of this isolating device 54 becomes clear when one considers the charging and discharging of capacitor $C_0$ 52 and $C_1$ 53. During a charging operation, devices 50A through 50C are in the "Off" state. Node 6 and hence capacitor $C_1$ 53 will charge to a voltage V through the load resistor. However, node a or capacitor $C_0$ 52 will charge only to some fraction of voltage V because of the isolating device 54. The threshhold voltage and gate voltage of device 54 are such that device 54 turns "Off" when capacitor $C_0$ 52 or node a reaches some fraction of the supply volage V. If capacitor $C_0 > C_1$ this will greatly reduce the time required to charge capacitor $C_1$ 53 and $C_0$ 52. Conversely during the discharge portion of the cycle when any or all of the devices 50A through 50C are "On" capacitor $C_0$ 52 has only some fraction of the supply voltage V across it initially and will, therefore, discharge more quickly than if it had the full voltage swing V to fall. Now, if $C_0 > C_1$ the discharge will be faster with the isolating device 54 than without it. Therefore, in those situations where capacitor $C_0$ represents a significant portion of the total node a capacitance isolating device 54 enhances the circuit performance by reducing the voltage swing on part of the node capacitance. It should be noted that even in the situation where $C_0$ is less than or equal to $C_1$ an advantage is gained.

Figure 8:
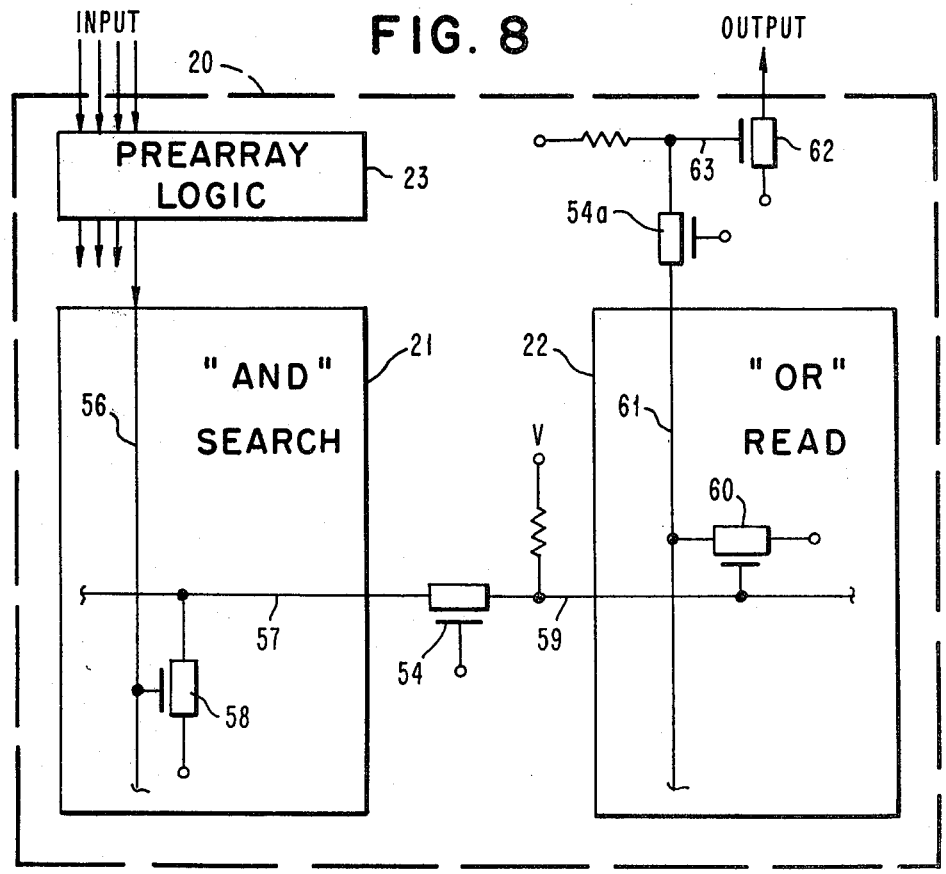
FIG. 8 is an illustration of a programmed array logic structure showing the isolation arrangement.

Referring next to FIG. 8 in accordance with the invention, the isolating circuit described in FIG. 7 is shown schematically applied to a programmed array logic device. In this device in a schematic chip 20 the inputs are shown to the prearray logic element 23 containing the partitioning driver as set forth in FIGS. 1, 4, 5 and 6. In the "AND" logic or "SEARCH" section part of the array labelled 21, an example line 56 is shown. The output on the typical line 57 is connected to the source of a FET isolating transistor 54 which has its gate connected to a reference potential to establish a threshold as previously described. There is one transistor of the element 54 type for each line between Sections 21 and 22. Line 59 connected to the drain of transistor 54 and to a drive V through a resistor then enters the "OR" logic or "READ" array 22 where it drives the gate of transistors in the "READ" array. The transistor 60 has its drain connected to line 61 which in turn goes through an isolating transistor 54A and through an inverter 62 to an output with the drain of the transistor 54A also connected to a drive voltage through a resistor.

The combination of the push-pull driver with the logic as described in FIGS. 1, 4, 5 and 6 and the isolating circuit of FIG. 7 results in the high performance programmed logic array of FIG. 8. This can be seen when one considers the various capacitance in the programmed logic array structure. The prearray logic circuit 23 which drives the input "AND" array signal line 56 is characterized by a large fanout which results in a large capacitance on line 56 the output line of the prearray circuit. The use of the "NOR" push-pull drive for the prearray logic circuit minimizes the time required to drive the capacitance since the "NOR" push-pull driver is ideally suited for driving large output capacitance. This has already been described in FIGS. 1, 4, 5 and 6.

Typical programmed array logic structures are characterized by high fanin capacitance in the "AND" array, line 57, and low fanout capacitance on the input to the "OR" array, line 59. Thus when isolating, device 54 is used between the "AND" and "OR" arrays a considerable performance improvement is seen as already described in FIG. 7. An identical condition exists in the output line of the "OR" array. Output line 61 of the "OR" array is characterized by a large fanin and wiring capacitance. By placing an isolating device 54a between line 61 and the output segment of the line 63, considerable performance improvement is again achieved by the method described in FIG. 7. What has been done is to use the "NOR" push-pull driver in the prearray logic circuit where there is high fanout and the isolating circuit in the "AND" and "OR" arrays where there is generally high fanin. Each of these circuits has advantages in these environments and the combination results in a high performance low power static PLA which otherwise would not be achievable.

What has been described is a technique of assembling FET logic wherein a push-pull driver may be incorporated into a prearray partitioning circuit which in turn with a isolation type circuitry provides an extremely sensitive and high performance programmed array logic.

Having described the invention, what is claimed as new and what is desired to secure by Letters Patent is:

1. A prearray logic section of a programmed logic array having a partitioning logic circuit wherein each logical input variable is combined and duplicated to provide a separate output for each of all possible logical combinations of all logical input variables and wherein each said output having a driver circuit comprising:
   a first FET transistor having its source connected to the reference potential of said logic circuit and having its drain connected through a load device to a drive voltage;
   means connecting the input to the gate of said first FET transistor;
   a second and a third FET transistor of the type exhibiting no conduction in the "off" condition connected in series source-to-drain with said second FET transistor adjacent to the reference potential of said logic circuit and said third FET transistor adjacent to a drive voltage;
   means connecting the output to the junction between said second and third series connected FET transistors;
   means connecting the input to the gate of said third series connected FET transistor; and
   means connecting the output of said first FET transistor to the gate of said second FET transistor.

2. In a programmed logic array circuit of the type having a prearray logic section, an "AND" or "SEARCH" section and an "OR" or "READ" section arranged serially respectively between the input and output thereof the improvement comprising a partitioning logic circuit in said prearray logic section wherein each logical input variable is combined and duplicated to provide a separate prearray logic output line for each of all possible logical combinations of all logical input variables each said prearray logic output line having a driver circuit comprising:
   a first FET transistor having its source connected to the reference potential of said programmed logic array circuit and having its drain connected through a load device to a drive voltage;
   means connecting one said prearray logic output line to the gate of said first transistor;
   a second and a third FET transistor of the type exhibiting no conduction in the "off" condition connected in series source-to-drain with said second FET transistor adjacent to the reference potential of said programmed logic array circuit and said third FET transistor adjacent to a drive voltage;
   means connecting the output of said driver circuit to the junction between said second and third series connected FET transistors;
   means connecting said one prearray logic output line to the gate of said third series connected FET transistor; and
   means connecting the output of said first FET transistor to the gate of said second FET transistor.

3. The programmed logic array circuit of claim 2 including the further improvement of at least one isolation circuit positioned in at least one of the "AND" and "OR" section output lines comprising:
   an FET transistor having the gate thereof connected to the reference potential of said programmed logic array circuit and having the drain thereof connected through an impedance to a drive voltage means connecting the source
   electrode thereof to the output of the previous serially connected section and means connecting the drain thereof to at least one of the next section and the programmed logic array circuit output.

* * * * *